United States Patent
Steiger et al.

(10) Patent No.: US 7,704,785 B2
(45) Date of Patent: Apr. 27, 2010

(54) ORGANIC SEMICONDUCTOR SOLUTIONS, PROCESSES FOR FORMING ORGANIC SEMICONDUCTOR LAYERS THEREWITH AND DEVICES CONTAINING SUCH LAYERS

(75) Inventors: Jürgen Steiger, Düsseldorf (DE); Hubert Spreitzer, Viernheim (DE)

(73) Assignee: Merck Patent GmbH, Darmstadt (DE)

( * ) Notice: Subject to any disclaimer, the term of this patent is extended or adjusted under 35 U.S.C. 154(b) by 516 days.

(21) Appl. No.: 11/596,304

(22) PCT Filed: May 10, 2005

(86) PCT No.: PCT/EP2005/005022

§ 371 (c)(1),
(2), (4) Date: Nov. 13, 2006

(87) PCT Pub. No.: WO2005/112145

PCT Pub. Date: Nov. 24, 2005

(65) Prior Publication Data

US 2008/0265214 A1 Oct. 30, 2008

(30) Foreign Application Priority Data

May 11, 2004 (DE) .................. 10 2004 023 276

(51) Int. Cl.
| | |
|---|---|
| H01L 51/40 | (2006.01) |
| H01L 21/00 | (2006.01) |
| H01L 21/44 | (2006.01) |
| H01L 35/24 | (2006.01) |
| H01B 1/00 | (2006.01) |
| C08K 5/01 | (2006.01) |
| C08G 73/12 | (2006.01) |
| C09K 11/06 | (2006.01) |
| C09D 11/00 | (2006.01) |
| B05D 1/06 | (2006.01) |
| B05D 1/32 | (2006.01) |

(52) U.S. Cl. .................. 438/99; 438/82; 438/678; 427/469; 427/466; 524/474; 524/476; 524/369; 523/160; 257/40; 252/301.16; 252/500

(58) Field of Classification Search .................. 252/500, 252/301.16; 427/469, 466; 524/474, 476, 524/369; 523/160; 257/40; 438/99, 82, 438/678
See application file for complete search history.

(56) References Cited

U.S. PATENT DOCUMENTS

| | | | |
|---|---|---|---|
| 5,091,004 | A | 2/1992 | Tabayashi et al. |
| 6,994,893 | B2 * | 2/2006 | Spreitzer et al. ............ 427/469 |
| 2003/0127977 | A1 | 7/2003 | Bae et al. |
| 2003/0215571 | A1 | 11/2003 | Tahon et al. |
| 2004/0188672 | A1 | 9/2004 | Spreitzer et al. |

FOREIGN PATENT DOCUMENTS

| | | | | |
|---|---|---|---|---|
| EP | 0 610 929 | | 8/1994 | |
| JP | 4-180977 | | 6/1992 | |
| WO | WO-02/069119 | | 9/2002 | |
| WO | WO02/069119 | * | 9/2002 | .................. 252/500 |
| WO | WO-02/072714 | | 9/2002 | |
| WO | WO-03/019693 | | 3/2003 | |
| WO | WO03/019693 | * | 3/2003 | .................. 257/40 |

OTHER PUBLICATIONS

Hebner, T. R. et al., "Ink-jet Printing of Doped Polymers for Organic Light Emitting Devices", Applied Physics Letters, vol. 72, No. 5 (1998), pp. 519-521.

* cited by examiner

*Primary Examiner*—Ling-Siu Choi
*Assistant Examiner*—Monique Peets
(74) *Attorney, Agent, or Firm*—Connolly Bove Lodge & Hutz LLP

(57) ABSTRACT

Solutions comprising: (i) at least one organic semiconductor, (ii) at least one organic solvent A having a boiling point, and (iii) at least one organic solvent B having a boiling point; wherein the at least one organic semiconductor comprises at least one high molecular weight component, wherein the at least one organic solvent A is a good solvent for the at least one organic semiconductor, wherein the at least one organic solvent B is a poor solvent for the at least one organic semiconductor; and wherein the boiling point of the at least one solvent A is greater than the boiling point of the at least one solvent B; and the use of such solutions in processes for forming organic semiconductor layers on substrates and devices formed by such processes.

19 Claims, 1 Drawing Sheet

Figure 1 (top): comparison of brightness against voltage;
(bottom) current density against voltage.
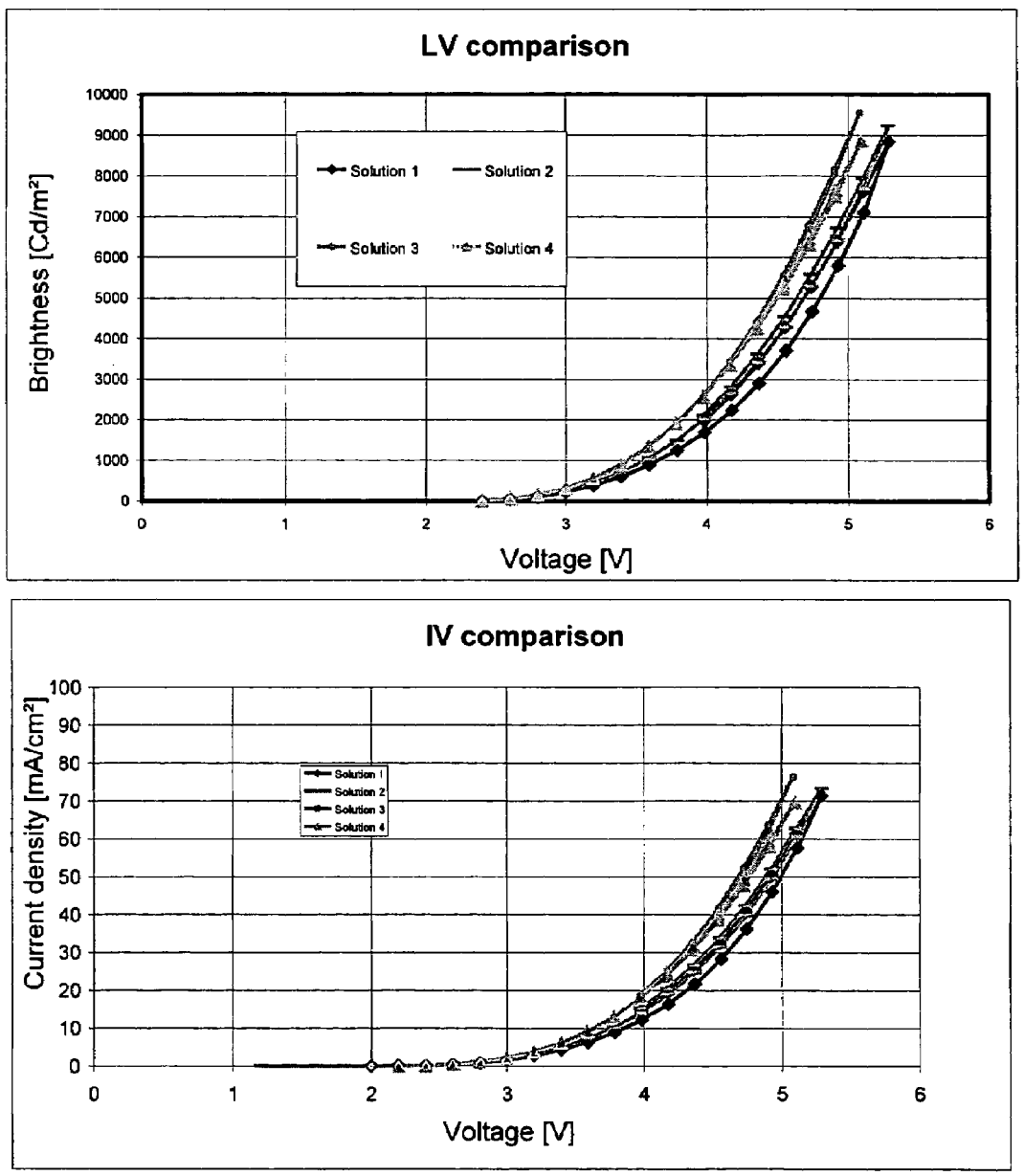

ORGANIC SEMICONDUCTOR SOLUTIONS, PROCESSES FOR FORMING ORGANIC SEMICONDUCTOR LAYERS THEREWITH AND DEVICES CONTAINING SUCH LAYERS

CROSS-REFERENCE TO RELATED APPLICATIONS

This application is a national stage application, under 35 U.S.C. §371, of PCT/EP2005/005022 filed May 10, 2005, which claims benefit under 35 U.S.C. §119 to German Patent Application No. 10 2004 023 276.8, filed May 11, 2004.

BACKGROUND OF THE INVENTION

The present invention relates to solutions of organic semiconductors, and to the use thereof in the electronics industry.

The use of organic semiconductors as functional materials has been reality for some time or is expected in the near future in a number of different applications which can be ascribed to the electronics industry in the broadest sense. The development of organic transistors (O-TFTs, O-FETs), organic integrated circuits (O-ICs) and organic solar cells (O-SCs) is already very well advanced at the research stage, so that market introduction can be expected in the next few years. In the case of organic electroluminescent devices (OLEDs), the market introduction has already taken place, as confirmed, for example, by the car radios from Pioneer or a digital camera from Kodak with an "organic display". A first product is also available on the market in the case of polymeric light-emitting diodes (PLEDs) in the form of a small display in a shaver from Philips N. V. The general structure of such PLEDs is shown in WO 90/13148. In spite of all advances, significant improvements are still necessary in order to make these displays a true competitor to the liquid-crystal displays (LCDs) which currently dominate the market.

In order to obtain full-colour display devices, it is necessary to develop coating methods which allow the three primary colours (red, green, blue) to be applied in a spatially separated manner. Since the polymers are generally applied from solution, printing processes are a means of choice here. Owing to the good controllability, the achievable resolution and the large variability, it is principally ink-jet printing (IJP) processes that are currently being worked on. In principle, however, other printing processes, such as, for example, offset printing, transfer printing or gravure printing processes, are also suitable. On the other hand, corresponding colour displays can also be produced by photolithographic processes; in this case, area-coating processes can then be used, as are also described below for single-colour displays. For all these possibilities, suitable polymer solutions which are on the one hand suitable for printing, but on the other hand also do not impair the properties of the PLEDs, are required. Suitable polymer solutions are also required for single-colour display devices, which can be produced, for example, by spin coating. Since it is generally known that the choice of solvents and also the solubility of the polymers in this solvent or the solvent mixture has a crucial effect on the morphology of the film formed, the electroluminescence behaviour can also be controlled thereby.

WO 02/069119 describes solutions of organic semiconductors for use in ink-jet printing processes in which solvent mixtures comprising a poor solvent having a relatively high boiling point and a good solvent having a relatively low boiling point are used. Evaporation of the more volatile solvent rapidly produces during drying a saturated solution of the material, which consequently precipitates. This prevents radial flow of the material to the edges of the pixel and facilitates relatively uniform material distribution. However, this method has the crucial disadvantage that the material does not dry uniformly, but instead a precipitate forms which results in clear inhomogeneities of the film. US 2003/0127977 shows, for example by SEM (scanning electron microscopy), that a film exhibits poor properties if the material precipitates during drying. This makes uniform and homogeneous electroluminescence from the pixel impossible. Furthermore, the irregularity of the film means that a uniform current flow is impossible. It is thought that preferred current channels thereby form, which ultimately result in short circuits and thus significantly lower stability of the device. Some experience which these experiments have recreated has furthermore shown that these inhomogeneous pixels result in a reduction in the luminous efficiency. Thus, although these solutions possibly result in improved applicational properties for ink-jet printing, such solutions cannot be widely used if these are accompanied by an impairment of the electroluminescence properties.

WO 02/072714 proposes solutions in a mixture of two (or also three) solvents, where both solvents have a boiling point of below 200° C. and one solvent has a boiling point between 140° C. and 200° C., which furthermore contain no benzylic $CH_2$ and CH groups and have certain restrictions for the substituents on aromatic solvents. It is described as particularly favourable if the solution thickens rapidly. This is achieved by using binary or ternary solvent mixtures in which the organic semiconductor has the lowest solubility in the solvent having the highest boiling point or is very thick or gelatinous in this solvent. A rapid increase in viscosity then occurs during thickening. However, it is not always possible to find suitable solvent systems having such a composition in which the organic semiconductor thickens rapidly without precipitating in the process.

EP 1134269 describes that it is particularly advantageous for solutions of polymeric fluorescent substances which have at least one arylene-vinylene unit to have a content of poor solvent of not more than 10,000 ppm, preferably not more than 5000 ppm (determined by gas chromatography), where the lower limit is not defined. Elsewhere in the description, the preferred upper limit is even indicated as a content of poor solvent of not more than 1000 ppm, which corresponds to about 0.1% by weight (at comparable density). Poor solvents are described as being especially alcohols, in particular methanol, ethanol and isopropanol. The advantage of these solutions is stated to be a higher luminous efficiency, which is confirmed in one example (with a poly-para-phenylenevinylene derivative).

BRIEF SUMMARY OF THE INVENTION

On repetition of this example, however, we were not able to reproduce these results. On the contrary, we have found that, in particular, a higher proportion of a poor solvent in the polymer solution results in significantly steeper current/voltage/brightness curves and in higher luminous efficiencies. This is a surprising result which is in contradiction to the above-mentioned descriptions. The present invention therefore relates to polymer solutions of this type.

The invention relates to single-phase, liquid compositions (solutions) comprising at least one organic semiconductor which comprises at least one high-molecular-weight component, and at least one organic solvent A which is a good solvent for the organic semiconductor, and at least one organic solvent B which is a poor solvent for the organic semiconductor, characterised in that the following applies to the boiling points (b.p.) of solvents A and B: b.p.(A)>b.p.(B).

For the purposes of this application text, solutions are liquid, homogeneous mixtures of solid substances in liquid solvents in which the solids are in molecularly disperse dissolved form, i.e. the majority of the molecules of the solid are actually dissolved and are not in the form of aggregates or nano- or microparticles.

For the purposes of this invention, an organic solvent is intended to be taken to mean organic substances which are able to bring other substances into solution by physical means without the dissolving or dissolved substance changing chemically during the dissolution process.

For the purposes of this invention, a good solvent is intended to be taken to mean an organic solvent in which the organic semiconductor is soluble at a concentration of at least 5 g/l at room temperature and atmospheric pressure with formation of a clear, flowable solution.

For the purposes of this invention, a poor solvent is intended to be taken to mean an organic solvent in which the organic semiconductor does not give a clear solution, i.e. in which it flocculates or forms a gel, at the above-mentioned concentration at room temperature and atmospheric pressure. The solubility of the organic semiconductor at room temperature and atmospheric pressure is preferably less than 3 g/l, particularly preferably less than 1 g/l, especially less than 0.3 g/l.

For the purposes of the present invention, room temperature is 20° C., and atmospheric pressure means 1013 mbar.

The invention furthermore relates to the use of the solutions according to the invention for producing layers of the organic semiconductor on a substrate.

A preferred embodiment here is the use of printing processes for the production of the organic semiconductor layers. Particular preference is given here to the use of ink-jet printing (IJP) processes.

A further preferred embodiment is the use of area-coating processes for the production of the organic semiconductor layers, in particular the use of spin coating.

The invention furthermore relates to layers of the organic semiconductors produced using the solutions according to the invention.

The invention furthermore relates to organic electronic devices, such as, for example, organic field-effect transistors (O-FETs), organic thin-film transistors (O-TFTs), organic integrated circuits (O-ICs), organic solar cells (O-SCs) or organic laser diodes (O-lasers), but in particular organic and polymeric light-emitting diodes (OLEDs, PLEDs), comprising at least one layer according to the invention.

Layers of the organic semiconductors known per se have already been described in the literature. The layers produced from the solutions according to the invention exhibit improved electronic properties compared with those described to date (this is confirmed, inter alia, in Examples 1 to 4). In particular, steeper current/voltage/-brightness curves and higher luminous efficiencies are obtained with the layers produced from the solutions according to the invention.

For the purposes of this application, organic semiconductors are low-molecular-weight, oligomeric, dendritic, lightly to strongly branched, and in particular polymeric, organic or organometallic compounds or mixtures of compounds which, as a solid or layer, have semiconducting properties, i.e. in which the energy gap between the conduction and valence bands is between 0.1 and 4 eV, preferably between 1.0 and 3.5 eV.

BRIEF DESCRIPTION OF THE DRAWINGS

FIG. 1 compares brightness against voltage and
FIG. 2 compares current density against voltage.

DETAILED DESCRIPTION OF THE INVENTION

The organic semiconductor used here is either a pure component, which then only comprises one high-molecular-weight component, or a mixture of two or more components, at least one of which must have semiconducting properties. In the case of the use of mixtures, however, it is not necessary for each component to have semiconducting properties. Thus, for example, inert low-molecular-weight compounds can be used together with semiconducting polymers. It is likewise possible to use non-conducting polymers, which serve as inert matrix or binder, together with one or more low-molecular-weight compounds or further polymers having semiconducting properties.

The high-molecular-weight component, which may be oligomeric, dendritic, lightly to strongly branched, and in particular polymeric, has a molecular weight $M_w$ of greater than 3000 g/mol, preferably of greater than 10,000 g/mol, particularly preferably of greater than 50,000 g/mol.

For the purposes of this application, the potentially admixed non-conducting component is taken to mean an electro-optically inactive, inert, passive compound. This component may, as usual in the case of surface-coating formulations, be referred to as binder.

Preference is given to solutions of polymeric organic semiconductors (which may comprise further admixed substances). For the purposes of the present description, polymeric organic semiconductors are taken to mean, in particular, (i) the substituted poly-p-arylenevinylenes (PAVs) disclosed in EP 0443861, WO 94/20589, WO 98/27136, EP 1025183, WO 99/24526, DE 19953806 and EP 0964045 which are soluble in organic solvents, (ii) the substituted polyfluorenes (PFs) disclosed in EP 0842208, WO 00/22027, WO 00/22026, DE 19846767, WO 00/46321, WO 99/54385 and WO 00/55927 which are soluble in organic solvents, (iii) the substituted polyspirobifluorenes (PSFs) disclosed in EP 0707020, WO 96/17036, WO 97/20877, WO 97/31048, WO 97/39045 and WO 03/020790 which are soluble in organic solvents, (iv) the substituted poly-para-phenylenes (PPPs) or -biphenylenes disclosed in WO 92/18552, WO 95/07955, EP 0690086, EP 0699699 and WO 03/099901 which are soluble in organic solvents, (v) the substituted polydihydrophenanthrenes (PDHPs) disclosed in WO 05/014689 which are soluble in organic solvents, (vi) the substituted poly-trans-indenofluorenes and poly-cis-indenofluorenes (PIFs) disclosed in WO 04/041901 and WO 04/113412 which are soluble in organic solvents, (vii) the substituted polyphenanthrenes disclosed in the unpublished application DE 102004020298.2 which are soluble in organic solvents, (viii) the substituted polythiophenes (PTs) disclosed in EP 1028136 and WO 95/05937 which are soluble in organic solvents, (ix) the polypyridines (PPys) disclosed in T. Yamamoto et al., *J. Am. Chem. Soc.* 1994, 116, 4832 which are soluble in organic solvents,
(x) the polypyrroles disclosed in V. Gelling et al., *Polym. Prepr.* 2000, 41, 1770 which are soluble in organic solvents,
(xi) substituted, soluble copolymers which have structural units from two or more of classes (i) to (ix), as described, for example, in WO 02/077060,
(xii) the conjugated polymers disclosed in *Proc. of ICSM '98*, Part I & II (in: *Synth. Met.* 1999, 101/102) which are soluble in organic solvents,
(xiii) substituted and unsubstituted polyvinylcarbazoles (PVKs), as disclosed, for example, in R. C. Penwell et al., *J. Polym. Sci., Macromol. Rev.* 1978, 13, 63-160,
(xiv) substituted and unsubstituted triarylamine polymers, as disclosed, for example, in JP 2000/072722, and
(xv) soluble polymers containing phosphorescent units, as disclosed, for example, in EP 1245659, WO 03/001616, WO 03/018653, WO 03/022908, WO 03/080687, EP 1311138, WO 03/102109, WO 04/003105, WO 04/015025 and some of the specifications already cited above.

Preference is furthermore also given to solutions of non-conducting polymers (matrix polymers) which comprise admixed low-molecular-weight, oligomeric, dendritic, lightly to strongly branched, and/or polymeric organic and/or organometallic semiconductors.

The solutions according to the invention comprise between 0.01 and 20% by weight, preferably between 0.1 and 15% by weight, particularly preferably between 0.2 and 10% by weight, very particularly preferably between 0.25 and 5% by weight, of the organic semiconductor or the corresponding blend. The percent data relate to 100% for the entire mixture of the solvents.

The viscosity of the solutions according to the invention is variable. However, certain coating techniques require use of certain viscosity ranges. Thus, a range from about 4 to 25 mPa·s is advantageous for coating by IJP. For area coatings (such as spin coating), viscosities in the range from about 5 to 40 mPa*s may be advantageous. For other printing processes, for example gravure printing processes, however, it is also entirely possible for a significantly higher viscosity, for example in the range from 20 to 500 mPa·s, to give rise to advantages. The viscosity can be adjusted through the choice of the suitable molecular-weight range of the organic semiconductor or matrix polymer and through the choice of a suitable concentration range and choice of the solvents.

The surface tension of the solutions according to the invention is initially not restricted. Through the use of corresponding solvent mixtures and the application, however, this will generally be in the range from 20 to 60 dyn/cm, preferably in the range from 25 to 50 dyn/cm, very particularly preferably in the range from 25 to 40 dyn/cm.

The solutions according to the invention comprise—as described above—at least two different organic solvents A and B, of which solvent A is a good solvent for the organic semiconductor and solvent B is a poor solvent for the organic semiconductor, and where in addition the following applies to the boiling points (b.p.) of the solvents: b.p.(A)>b.p.(B).

It is preferred here for the boiling point of solvent A to be greater than 80° C., preferably greater than 100° C., particularly preferably greater than 110° C., for ink-jet printing very particularly preferably greater than 140° C. A further technical restriction that has already been achieved with this preference is the avoidance of some solvents which are toxic or have been proven to be carcinogenic, which applies, for example, to chloroform (b.p. 61° C.), tetrachloromethane (b.p. 77° C.) and benzene (b.p. 80° C.). This boiling-point limit is technically appropriate since it has been shown that, on use of good solvents having a lower boiling point in ink-jet printing, drying of the nozzles occurs within a few seconds after completion of the printing operation. As soon as this value is at least about 10 seconds, drying-out can be prevented by suitable technical aids (for example print head moves into wait position, nozzles are mechanically sealed with a cap). For spin coating too, a solvent having an excessively low boiling point is not preferred since this results in morphologically less favourable layers.

The boiling point of solvent A is furthermore preferably less than 300° C., preferably less than or equal to 270° C., particularly preferably less than or equal to 250° C. In the case of higher-boiling solvents, the residual solvent after film formation can only be removed completely with difficulty and with considerable technical effort.

The sensible lower limit for the boiling point of solvent B is 50° C. A lower boiling point makes reproducible preparation of the solutions or layers difficult since one solution component is then too volatile. Furthermore, the boiling point of solvent B is preferably less than 250° C., particularly preferably less than or equal to 200° C., very particularly preferably less than or equal to 150° C.

The melting point of solvents A and B is preferably less than or equal to 15° C. Such a melting point is sensible since the solutions must under certain circumstances (between preparation and use) be stored for days to months or possibly also transported. It must be ensured here that the solutions also remain stable as such and do not freeze out during storage, transport and/or relatively small temperature variations or suffer other disadvantageous storage and/or transport damage.

It is furthermore preferred for the difference of the boiling points between solvent A and solvent B to be more than 5 K, preferably more than 10 K, particularly preferably more than 20 K, very particularly preferably more than 30 K.

The ratio of solvents A and B to one another can be varied in broad ranges. However, in order to achieve the best effects, solvent A should be used in a proportion of 50 to 99.9% by vol., preferably 70 to 99.8% by vol., particularly preferably 85 to 99.5% by vol., very particularly preferably 90 to 99% by vol. Correspondingly, solvent B should be used in a proportion of 0.1 to 50% by vol., preferably 0.2 to 30% by vol., particularly preferably 0.5 to 15% by vol., very particularly preferably 1 to 10% by vol. The total percentage of the proportions of the respective solvent mixture always adds up to 100% here.

It may also be appropriate also to use further good and/or poor solvents in addition to solvents A and B. Thus, it may be entirely appropriate and preferred in each case to use two or more solvents of type A and/or type B since optimisation with respect to further requisite parameters (for example matching of the surface tension, the viscosity, etc.) can in some cases thereby be achieved more simply compared with the case where only precisely one solvent of each type is used. For the proportions of the solvents, it in turn applies that the proportions of all solvents A or all solvents B are preferably in the range as described above.

It may furthermore also be appropriate to add further additives, as described, for example, in WO 03/019693, in addition to the organic semiconductor or blend.

The use of, for example, aldehyde-containing solvents, nitrated aromatics and phosphorus-containing solvents (poor stability of the solutions) and of styrene derivatives or other reactive olefins (polymerisation tendency of the solvents) has proven to be not very advantageous. Compounds which tend to form peroxides, such as, for example, diethyl ether or tetrahydrofuran, have likewise proven to be not very suitable.

Preferred solvents A which have proven to be good solvents for a wide range of organic semiconductors or also inert matrix polymers are mono- or polysubstituted aromatic solvents, in particular substituted benzenes, naphthalenes, biphenyls and pyridines. Preferred substituents are alkyl groups, which may also be fluorinated, halogen atoms, preferably chlorine and fluorine, cyano groups, alkoxy groups, di-alkylamino groups, preferably those having not more than 4 C atoms, or ester groups. Particularly preferred substituents are fluorine, chlorine, cyano, methoxy, ethoxy, methyl, trifluoromethyl, methyl carboxylate and/or ethyl carboxylate, where a plurality of different substituents may also be present. However, non-aromatic solvents, such as, for example, formic acid derivatives, N-alkylpyrrolidones or high-boiling ethers, are also suitable as good solvents.

Particular preference is given to the solvents having a boiling point of between 100 and 300° C. listed in Table 1 below. However, particularly suitable solvents must be determined separately for each organic semiconductor, and consequently this table can only give a general point of reference.

TABLE 1

Particularly preferred good solvents A

| Solvent | CAS number | Boiling point [° C.] | Melting point [° C.] |
|---|---|---|---|
| 3-Fluorobenzotrifluoride | 401-80-9 | 102 | −81 |
| Benzotrifluoride | 98-08-8 | 102 | −29 |
| Dioxane | 123-91-1 | 102 | 12 |
| Trifluoromethoxybenzene | 456-55-3 | 102 | −50 |
| 4-Fluorobenzotrifluoride | 402-44-8 | 103 | −41 |
| 3-Fluoropyridine | 372-47-4 | 108 | n.s. |
| Toluene | 108-88-3 | 111 | −93 |
| 2-Fluorotoluene | 95-52-3 | 113 | −62 |
| 2-Methylthiophene | 554-14-3 | 113 | −63 |
| 2-Fluorobenzotrifluoride | 392-85-8 | 115 | −51 |
| 3-Fluorotoluene | 352-70-5 | 115 | −87 |
| Pyridine | 110-86-1 | 115 | −42 |
| 4-Fluorotoluene | 352-32-9 | 116 | −56 |
| 2,5-Difluorotoluene | 452-67-5 | 120 | −35 |
| 1-Chloro-2,4-difluorobenzene | 1435-44-5 | 127 | −26 |
| 2-Fluoropyridine | 372-48-5 | 127 | n.s. |
| 3-Chlorofluorobenzene | 625-98-9 | 127 | n.s. |
| 1-Chloro-2,5-difluorobenzene | 2367-91-1 | 128 | −25 |
| 4-Chlorofluorobenzene | 352-33-0 | 130 | −27 |
| Chlorobenzene | 108-90-7 | 132 | −45 |
| 2-Chlorofluorobenzene | 348-51-6 | 138 | −42 |
| p-Xylene | 106-42-3 | 138 | 12 |
| m-Xylene | 108-38-3 | 139 | −47 |
| o-Xylene | 95-47-6 | 144 | −24 |
| 2,6-Lutidine | 108-48-5 | 145 | −6 |
| 2-Fluoro-m-xylene | 443-88-9 | 147 | n.s. |
| 3-Fluoro-o-xylene | 443-82-3 | 150 | n.s. |
| 2-Chlorobenzotrifluoride | 88-16-4 | 152 | −7 |
| Dimethylformamide | 68-12-2 | 153 | −61 |
| 2-Chloro-6-fluorotoluene | 443-83-4 | 154 | −27 |
| 2-Fluoroanisole | 321-28-8 | 154 | −39 |
| Anisole | 100-66-3 | 154 | −37 |
| 2,3-Dimethylpyrazine | 5910-89-4 | 156 | n.s. |
| Bromobenzene | 106-86-1 | 156 | −31 |
| 4-Fluoroanisole | 459-60-9 | 157 | −45 |
| 3-Fluoroanisole | 456-49-5 | 160 | −35 |
| 3-Trifluoromethylanisole | 454-80-0 | 160 | −65 |
| 2-Methylanisole | 578-58-5 | 170 | −34 |
| Phenetol | 103-73-1 | 170 | −30 |
| 1,3-Benzodioxole | 274-09-9 | 173 | −18 |
| 4-Methylanisole | 104-93-8 | 174 | −32 |
| 3-Methylanisole | 100-84-5 | 175 | −55 |
| 4-Fluoro-3-methylanisole | 2338-54-7 | 175 | n.s. |
| 1,2-Dichlorobenzene | 95-50-1 | 180 | −17 |

TABLE 1-continued

Particularly preferred good solvents A

| Solvent | CAS number | Boiling point [° C.] | Melting point [° C.] |
|---|---|---|---|
| 2-Fluorobenzonitrile | 394-47-8 | ~180 | n.s. |
| 4-Fluoroveratrol | 398-62-9 | ~180 | n.s. |
| 2,6-Dimethylanisole | 1004-66-6 | 182 | n.s. |
| Aniline | 62-53-3 | 184 | −6 |
| 3-Fluorobenzonitrile | 403-54-3 | 185 | −16 |
| 2,5-Dimethylanisole | 1706-11-2 | 190 | ~5 |
| 2,4-Dimethylanisole | 6738-23-4 | 191 | n.s. |
| Benzonitrile | 100-47-0 | 191 | −13 |
| 3,5-Dimethylanisole | 874-63-5 | 193 | n.s. |
| N,N-Dimethylaniline | 121-69-7 | 194 | 2 |
| 1-Fluoro-3,5-dimethoxybenzene | 52189-63-6 | ~195 | n.s. |
| Phenyl acetate | 122-79-2 | 196 | −30 |
| N-Methylaniline | 100-61-8 | 196 | −57 |
| Methyl benzoate | 93-58-3 | 198 | −12 |
| N-Methylpyrrolidone | 872-50-4 | 199 | −24 |
| 3,4-Dimethylanisole | 4685-47-6 | 200 | n.s. |
| o-Tolunitrile | 529-19-1 | 205 | −13 |
| Veratrol | 91-16-7 | 207 | 15 |
| Ethyl benzoate | 93-89-0 | 212 | −34 |
| N,N-Diethylaniline | 91-66-7 | 217 | −38 |
| Propyl benzoate | 2315-68-6 | 231 | −51 |
| 1-Methylnaphthalene | 90-12-0 | 243 | −22 |
| Butyl benzoate | 136-60-7 | 250 | −22 |
| 2-Methylbiphenyl | 643-58-3 | 255 | n.s. |
| 2-Phenylpyridine | 1008-89-5 | ~270 | n.s. |
| 2,2'-Bitolyl | 605-39-0 | ~300 | n.s. |

The solvents listed in Table 1 cannot make any claim to completeness. The preparation of a solution according to the invention is also readily possible for the person skilled in the art without inventive step with other solvents not explicitly mentioned here.

Preference is thus given to solutions according to the invention comprising, as solvent A, one or more solvents selected from 3-fluorobenzotrifluoride, benzotrifluoride, dioxane, trifluoromethoxybenzene, 4-fluorobenzotrifluoride, 3-fluoropyridine, toluene, 2-fluorotoluene, 2-fluorobenzotrifluoride, 3-fluorotoluene, pyridine, 4-fluorotoluene, 2,5-difluorotoluene, 1-chloro-2,4-difluorobenzene, 2-fluoropyridine, 3-chlorofluorobenzene, 1-chloro-2,5-difluorobenzene, 4-chlorofluorobenzene, chlorobenzene, 2-chlorofluorobenzene, p-xylene, m-xylene, o-xylene, 2,6-lutidine, 2-fluoro-m-xylene, 3-fluoro-o-xylene, 2-chlorobenzotrifluoride, dimethylformamide, 2-chloro-6-fluorotoluene, 2-fluoroanisole, anisole, 2,3-dimethylpyrazine, bromobenzene, 4-fluoroanisole, 3-fluoroanisole, 3-trifluoromethylanisole, 2-methylanisole, phenetol, benzodioxole, 4-methylanisole, 3-methylanisole, 4-fluoro-3-methylanisole, 1,2-dichlorobenzene, 2-fluorobenzonitrile, 4-fluoroveratrol, 2,6-dimethylanisole, aniline, 3-fluorobenzonitrile, 2,5-dimethylanisole, 2,4-dimethylanisole, benzonitrile, 3,5-dimethylanisole, N,N-dimethylaniline, 1-fluoro-3,5-dimethoxybenzene, phenyl acetate, N-methylaniline, methyl benzoate, N-methylpyrrolidone, 3,4-dimethylanisole, o-tolunitrile, veratrol, ethyl benzoate, N,N-diethylaniline, propyl benzoate, 1-methylnaphthalene, butyl benzoate, 2-methylbiphenyl, 2-phenylpyridine or 2,2'-bitolyl.

Preferred solvents B which have proven to be poor solvents for a wide range of organic or organometallic, oligomeric, branched or unbranched, polymeric or dendritic semiconductors or also inert matrix polymers are straight-chain, branched or cyclic alkanes, preferably having more than five C atoms. Corresponding industrial distillation fractions may also be selected here. Terpenes, (cyclo)aliphatic alcohols, ethers, ketones, carboxylic acid esters or mono-or polysubstituted aromatic solvents, in particular substituted benzenes, naphthalenes and pyridines which are substituted by very long alkyl or alkoxy substituents, are also suitable.

Particular preference is given to the solvents B having a boiling point of between 50 and 250° C. listed in Table 2 below, where again the particularly suitable solvents for each organic semiconductor must be determined separately here, and consequently this table can again only be taken as a general point of reference.

TABLE 2

Particularly preferred poor solvents B

| Solvent | CAS number | Boiling point [° C.] | Melting point [° C.] |
|---|---|---|---|
| tert-Butyl methyl ether | 1634-04-4 | 55 | −109 |
| Acetone | 67-64-1 | 57 | −95 |
| Methanol | 67-56-1 | 65 | −98 |
| Hexane | 110-54-3 | 69 | −96 |
| Ethyl acetate | 141-78-6 | 77 | −84 |
| Ethanol | 64-17-5 | 78 | −130 |
| 2-Butanone | 78-93-3 | 80 | −87 |
| Cyclohexane | 110-82-7 | 81 | 7 |
| 2-Propanol | 67-63-0 | 82 | −89 |
| tert-Butanol | 75-65-0 | 82 | 26 |
| 1-Propanol | 71-23-8 | 97 | −127 |
| 2-Butanol | 78-92-2 | 98 | −115 |
| Heptane | 142-82-5 | 98 | −91 |
| 2-Pentanone | 107-87-9 | 100-110 | −78 |
| Methylcyclohexane | 108-87-2 | 101 | −127 |
| 3-Pentanone | 96-22-0 | 102 | −40 |
| 3-Pentanol | 584-02-1 | 116 | −8 |
| 1-Butanol | 71-36-3 | 118 | −89 |
| cis/trans-1,4-Dimethylcyclohexane | 589-90-2 | 120 | −87 |
| cis/trans-1,3-Dimethylcyclohexane | 591-21-9 | 121-124 | n.s. |
| Ethylene glycol monomethyl ether | 109-86-4 | 124 | −85 |
| cis/trans-1,2-Dimethylcyclohexane | 583-57-3 | 124 | n.s. |
| Octane | 111-65-9 | 126 | −57 |
| Cyclopentanone | 120-92-3 | 130-131 | −51 |
| 2-Hexanol | 626-93-7 | 136 | n.s. |
| 1-Pentanol | 71-41-0 | 138 | −79 |
| 1,2,4-Trimethylcyclohexane | 2234-75-5 | 142 | n.s. |
| 4-Heptanone | 123-19-3 | 145 | −33 |
| 3-Heptanone | 106-35-4 | 148 | −39 |
| 2-Heptanone | 110-43-0 | 150 | −35 |
| Nonane | 111-84-2 | 151 | −51 |
| 3-Heptanol | 589-82-2 | 156 | −70 |
| 1-Hexanol | 111-27-3 | 157 | −52 |
| 2-Heptanol | 543-49-7 | 161 | n.s. |
| Diglyme | 111-96-6 | 162 | −64 |
| Butyl butyrate | 109-21-7 | 165 | n.s. |
| tert-Butylbenzene | 98-06-6 | 169 | −58 |
| Decane | 124-18-5 | 174 | −30 |
| 1-Heptanol | 111-70-6 | 176 | −36 |
| 2-Octanol | 123-96-6 | 179 | −39 |
| Butylcyclohexane | 1678-93-9 | 180 | −78 |
| 2-Ethyl-1-hexanol | 104-76-7 | 185 | −76 |
| Decalin | 91-17-8 | 187 | −31 |
| Propylene glycol | 57-55-6 | 187 | −60 |
| Dimethyl sulfoxide | 867-68-5 | 189 | 19 |
| Glycol | 107-21-1 | 198 | −13 |
| 3,7-Dimethyl-1-octanol | 106-21-8 | about 200 | n.s. |
| 3,7-Dimethyl-3-octanol | 78-69-3 | about 200 | n.s. |
| Dimethyl succinate | 106-65-0 | 200 | 18 |
| Benzyl alcohol | 100-51-6 | 205 | −15 |
| DBE (industrial mixture of dimethyl succinate and dimethyl glutarate) | "106-65-0" | 196-215 | n.s. |
| Dodecane | 112-40-3 | 215 | −12 |
| Diethyl succinate | 123-25-1 | 218 | −20 |
| Triglyme | 112-49-2 | 220 | −40 |

TABLE 2-continued

Particularly preferred poor solvents B

| Solvent | CAS number | Boiling point [° C.] | Melting point [° C.] |
|---|---|---|---|
| Dimethyl adipate | 627-93-0 | 230 | 8 |
| 1-Decanol | 112-30-1 | 233 | n.s. |
| Bicyclohexyl | 92-51-3 | 239 | 3 |
| 2-Pyrrolidone | 616-45-5 | 245 | 25 |

The solvents listed in Table 2 cannot make any claim to completeness. The preparation of a solution according to the invention is also readily possible for the person skilled in the art without inventive step with other solvents not explicitly mentioned here.

Preference is thus given to solutions according to the invention comprising, as solvent B, at least one solvent selected from tert-butyl methyl ether, acetone, methanol, hexane, ethyl acetate, ethanol, 2-butanone, cyclohexane, 2-propanol, tert-butanol, 1-propanol, 2-butanol, heptane, 2-pentanone, methylcyclohexane, 3-pentanone, 3-pentanol, 1-butanol, 1,4-dimethylcyclohexane, 1,3-dimethylcyclohexane, ethylene glycol monomethyl ether, 1,2-dimethylcyclohexane, octane, cyclopentanone, 2-hexanol, 1-pentanol, 1,2,4-trimethylcyclohexane, 4-heptanone, 3-heptanone, 2-heptanone, nonane, 3-heptanol, 1-hexanol, 2-heptanol, diglyme, butyl butyrate, tert-butylbenzene, decane, 1-heptanol, 2-octanol, butylcyclohexane, 2-ethyl-1-hexanol, decalin, propylene glycol, dimethyl sulfoxide, glycol, 3,7-dimethyl-1-octanol, 3,7-dimethyl-3-octanol, dimethyl succinate, benzyl alcohol, DBE, dodecane, diethyl succinate, triglyme, dimethyl adipate, 1-decanol, bicyclohexyl or 2-pyrrolidone.

In order to explain the invention in greater detail, some readily usable solvent mixtures according to the invention are given in Table 3. This only represents a point of reference.

TABLE 3

Examples of solvent mixtures according to the invention

| Solvent A | Solvent B |
|---|---|
| Toluene | Methanol |
| Toluene | Ethanol |
| o-Xylene | Methanol |
| o-Xylene | Ethanol |
| o-Xylene | 2-Propanol |
| o-Xylene | Hexane |
| Anisole | Methanol |
| Anisole | Ethanol |
| Anisole | Methanol/hexane |
| Methylanisole | Ethanol |
| Anisole/o-xylene | Methanol |
| Anisole/o-xylene | Ethanol |
| Anisole/o-xylene | Methanol/ethanol |

For preparation of the solutions, the organic semiconductor or blend is dissolved in the desired solvent mixture in the desired concentration. It may also be appropriate to dissolve the organic semiconductor or blend firstly in a part of the solvents, for example in solvent A, and then to add the remaining solvent(s), for example solvent B, to this solution. Since organic semiconductors and solutions thereof are in some cases unstable to oxygen or other air constituents, it may be appropriate to carry out this operation under an inert atmosphere, for example under nitrogen or argon. Furthermore, it may be appropriate to accelerate the dissolution process, for example by heating and/or stirring. Aggregates of the organic semiconductor or matrix polymer can also be comminuted here, for example by external mechanical action, for example by means of ultrasound, as described in WO 03/019694. The addition of further additives, as described, for example, in WO 03/019693, may likewise prove appropriate for the application. It has furthermore proven sensible to filter the solutions before use in order to free them from, for example, relatively small amounts of crosslinked constituents and/or dust particles.

It has been found that electroluminescent devices produced from solutions according to the invention exhibit better electroluminescence results, in particular steeper current/voltage/brightness curves and higher efficiency. This is a surprising and unexpected result which contradicts the results in the literature. Such solutions are thus more suitable than solutions in accordance with the prior art for the production of efficient electroluminescent devices. In addition, polymers and blend materials in films or pixels produced from solutions according to the invention exhibit absolutely no inhomogeneities in the electroluminescence.

The organic semiconductor does not precipitate out of the solution during drying of the solutions according to the invention. This results in significantly more homogeneous films than is the case with binary or ternary solvent systems, in which the organic semiconductor or other blend constituents have the lowest solubility in the highest-boiling solvent.

The present application text and also the examples below are directed, in particular, to solutions according to the invention for the production of polymeric light-emitting diodes and the corresponding displays. In spite of this restriction of the description, it is possible for the person skilled in the art, without further inventive step, also to use corresponding solutions according to the invention for the production of other devices, for example for organic field-effect transistors (O-FETs), organic thin-film transistors (O-TFTs), organic integrated circuits (O-ICs), organic solar cells (O-SCs) or also organic laser diodes (O-lasers), to mention but a few applications.

The present invention is explained in greater detail by the following examples without wishing it to be restricted thereto. The person skilled in the art will be able to prepare further solutions according to the invention from the description and the examples given without inventive step and use these in order to produce layers therefrom.

EXAMPLES

Example 1

Solutions of Polymer POLY1 in Mixtures of Toluene (Solvent A) and Methanol (Solvent B)

1.1 Materials Employed:

Polymer POLY1 is a PPV polymer which has been obtained by polymerisation of the monomers (numbering as in the examples in WO 99/24526; performance of the polymerisation analogous to the examples described therein) Z5, E3, E5 and Z1 in the ratio 49% to 35% to 15% to 1%. The batch POLY1-B64 used here has an $M_w$ of 1200 kg/mol, an $M_n$ of 370 kg/mol and an $M_p$ of 910 kg/mol. A 5 g/l solution in toluene has a viscosity (at 40 $s^{-1}$) of about 9.9 mPas and (at 500 $s^{-1}$) of about 9.1 mPas.

Solvents:
toluene; boiling point 111° C.; solubility of POLY1-B64>20 g/l.
methanol: boiling point 65° C.; solubility of POLY1-B64<0.05 g/l.

1.2 Investigation Regarding the Use in EL (Electroluminescence):

4 different solutions were prepared. These all comprised 5 g/l of POLY1-B64. The solutions had the following solvent composition:

Solution 1: 100% toluene

Solution 2: 99.8% toluene; 0.2% methanol (0.15%)

Solution 3: 99.4% toluene; 0.6% methanol (0.45%)

Solution 4: 98.0% toluene; 2.0% methanol (1.71%)

(The solvent composition determined by H-NMR is indicated in brackets; i.e. the actual methanol contents are somewhat lower than in the weighed-out amount, presumably due to preferential evaporation during $N_2$ saturation of the solution).

PLEDs (polymeric light-emitting diodes) were produced using the solutions. The PLEDs were in each case produced by spin coating (a general process in this respect is described, for example, in the above-mentioned WO 02/072714). The PLEDs had the following structure: ITO/PEDOT (20 nm)/LEP (80 nm)/Ba (5 nm), Ag (200 nm).

(ITO=indium tin oxide; PEDOT=polythiophene derivative, obtainable as dispersion from H. C. Starck; LEP=light-emitting polymer).

All solutions gave optically homogeneous layers absolutely no deficiencies. The PLEDs emitted yellow light (CIE-1931: X~0.51, Y~0.48).

The EL evaluation is compared in Table 4 and illustrated in FIG. 1.

TABLE 4

| Efficiencies and requisite voltages at certain brightnesses. | | | | |
|---|---|---|---|---|
| | @ Maximum Eff. [Cd/A] U [V] | @ 100 Cd/m² Eff. [Cd/A] U [V] | @ 800 Cd/m² Eff. [Cd/A] U [V] | @ 5000 Cd/m² Eff. [Cd/A] U [V] |
| Solution 1 | 13.72 | 11.98 | 13.71 | 12.37 |
| | 3.64 | 2.80 | 3.59 | 4.95 |
| Solution 2 | 14.11 | 12.17 | 14.08 | 12.85 |
| | 3.64 | 2.77 | 3.53 | 4.92 |
| Solution 3 | 14.66 | 12.55 | 14.63 | 13.46 |
| | 3.44 | 2.72 | 3.39 | 4.52 |
| Solution 4 | 14.58 | 12.51 | 14.60 | 13.44 |
| | 3.50 | 2.69 | 3.34 | 4.47 |

The PLEDs produced were also investigated with respect to operating lifetime. The PLEDs each gave the same lifetimes (within the boundary of measurement accuracy) at the same current densities.

The results from Example 1 show the following:

A methanol content in the indicated range from 0.2 to 2% increases the steepness of the current/voltage curves (i.e. higher currents at the same voltages) and also slightly increases the efficiency of the respective PLED.

This advantage is not bought at the expense of any disadvantages (for example operating lifetime). This is important for the application.

Especially owing to the results cited in the above-mentioned EP 1134269, the results indicated here are totally surprising.

Example 2

Solutions of Polymer POLY1 in Mixtures of Anisole (Solvent A) and 1-butanol (Solvent B)

2.1 Materials Employed:
Polymer POLY1: as described in Example 1.
Solvents:
  anisole; boiling point 154° C.; solubility of POLY1-B64>20 g/l.
  1-butanol: boiling point 118° C.; solubility of POLY1-B64<0.05 g/l.

2.2 Investigation Regarding the Use in EL:
4 different solutions were prepared. These all comprised 5 g/l of POLY1-B64. The solutions had the following solvent composition:
  Solution 5: 100% anisole
  Solution 6: 99.5% anisole; 0.5% 1-butanol (0.50%)
  Solution 7: 98.0% anisole; 2.0% 1-butanol (1.97%)
  Solution 8: 90% anisole; 10% 1-butanol (9.84%)
(The solvent composition determined by H-NMR is indicated in brackets; in this case, the 1-butanol content agrees very well with the weighed-out amount).
PLEDs were produced using the solutions analogously to the details in Example 1. The EL evaluation is compared in Table 5.

TABLE 5

Efficiencies and requisite voltages at certain brightnesses.

|  | @ Maximum Eff. [Cd/A] U [V] | @ 100 Cd/m² Eff. [Cd/A] U [V] | @ 800 Cd/m² Eff. [Cd/A] U [V] | @ 5000 Cd/m² Eff. [Cd/A] U [V] |
|---|---|---|---|---|
| Solution 5 | 13.79 | 10.43 | 13.34 | 12.67 |
|  | 3.84 | 2.84 | 3.74 | 5.31 |
| Solution 6 | 14.39 | 12.31 | 14.36 | 13.13 |
|  | 3.64 | 2.76 | 3.53 | 4.96 |
| Solution 7 | 14.56 | 12.32 | 14.51 | 13.41 |
|  | 3.66 | 2.74 | 3.49 | 4.97 |
| Solution 8 | 13.56 | 9.42 | 13.45 | 12.75 |
|  | 4.18 | 2.78 | 3.53 | 4.90 |

The results from Example 2 show the following:
Analogously to the results in Example 1, admixture of butanol again results in steeper IV (and LV) curves here. It could initially be concluded from the results of solution 8 that the desired effect has already been overcompensated at 10% butanol. At high luminous densities (cf. the 5000 Cd/m² values), the effect according to the invention again occurred.

Example 3

Solutions of Polymer POLY1 in Mixtures of Toluene (Solvent A) and Cyclohexane or n-heptane or ᵗbutyl methyl ether (Solvent B)

3.1 Materials Employed:
Polymer POLY1: as described in Example 1.
Solvents:
  toluene; boiling point 111° C.; solubility of POLY1-B64>20 g/l.
  cyclohexane: boiling point 81° C.; solubility of POLY1-B64<0.05 g/l.
  n-heptane: boiling point 98° C.; solubility of POLY1-B64<0.05 g/l.
  ᵗbutyl methyl ether: boiling point 55° C.; solubility of POLY1-B64<0.05 g/l.

3.2 Investigation Regarding the Use in EL:
4 different solutions were prepared. These all comprised 5 g/l of POLY1-B64. The solutions had the following solvent composition:
  Solution 9: 100% toluene
  Solution 10: 98.0% toluene; 2.0% cyclohexane (1.79%)
  Solution 11: 98.0% toluene; 2.0% n-heptane (1.92%)
  Solution 12: 98.0% toluene; 2.0% ᵗbutyl methyl ether (1.64%)
(The solvent composition determined by H-NMR is indicated in brackets).
PLEDs were produced using the solutions analogously to the details in Example 1. However, a PEDOT film with a thickness of 80 nm was used in this case (Examples 1 and 2: in each case 20 nm; see above).
The EL evaluation is compared in Table 6.

TABLE 6

Efficiencies and requisite voltages at certain brightnesses.

|  | @ Maximum Eff. [Cd/A] U [V] | @ 100 Cd/m² Eff. [Cd/A] U [V] | @ 800 Cd/m² Eff. [Cd/A] U [V] | @ 5000 Cd/m² Eff. [Cd/A] U [V] |
|---|---|---|---|---|
| Solution 9 | 12.13 | 10.42 | 12.11 | 10.85 |
|  | 3.79 | 2.87 | 3.71 | 5.14 |
| Solution 10 | 12.66 | 10.74 | 12.63 | 11.58 |
|  | 3.78 | 2.88 | 3.73 | 5.13 |
| Solution 11 | 13.00 | 11.17 | 12.98 | 11.86 |
|  | 3.81 | 2.93 | 3.88 | 5.51 |
| Solution 12 | 12.00 | 10.35 | 11.99 | 10.91 |
|  | 3.80 | 2.90 | 3.82 | 5.25 |

The results from Example 3 show the following:
In contrast to the results shown in Examples 1 and 2, no increases in the steepness of the IV characteristic lines are evident in the case of these solutions. However, the efficiency here is also generally improved. This result is also surprising.

Example 4

Solutions of Polymer POLY2 in Mixtures of Toluene (Solvent A) and Methanol (Solvent B)

4.1 Materials Employed:
Polymer POLY2 is a SPIRO polymer analogous to Example P27 in WO 03/020790 which was obtained by the SUZUKI polymerisation likewise described therein. The batch POLY2-B10 used here has an $M_w$ of 380 kg/mol, an $M_n$ of 100 kg/mol and an $M_p$ of 320 kg/mol. A 14 g/l solution in anisole/o-xylene (1:1) has a viscosity (at $40\ s^{-1}$) of about 6.3 mPas and (at $500\ s^{-1}$) of about 6.4 mPas.
Solvents:
  toluene; boiling point 111° C.; solubility of POLY2-B10 >35 g/l.
  methanol: boiling point 65° C.; solubility of POLY2-B10<0.05 g/l.

4.2 Investigation Regarding the Use in EL:

4 different solutions were prepared. These all comprised 11 g/l of POLY2-B10. The solutions had the following solvent composition:
Solution 13: 100% toluene
Solution 14: 99.8% toluene; 0.2% methanol (0.17%)
Solution 15: 99.4% toluene; 0.6% methanol (0.52%)
Solution 16: 98.0% toluene; 2.0% methanol (1.77%)

(The solvent composition determined by H-NMR is indicated in brackets; i.e. the actual methanol contents are somewhat lower than in the weighed-out amount, presumably due to preferential evaporation during $N_2$ saturation of the solution).

PLEDs were produced using the solutions analogously to the details in Example 1 (i.e. again also with 20 nm of PEDOT here).

All solutions gave optically homogeneous layers with absolutely no deficiencies. The PLEDs emitted red light (CIE-1931: X~0.67, Y~0.33).

The EL evaluation is compared in Table 7.

TABLE 7

Efficiencies and requisite voltages at certain brightnesses.

|  | @ Maximum Eff. [Cd/A] U [V] | @ 100 Cd/m² Eff. [Cd/A] U [V] | @ 800 Cd/m² Eff. [Cd/A] U [V] |
| --- | --- | --- | --- |
| Solution 13 | 2.04 | 1.88 | 1.59 |
|  | 2.84 | 3.38 | 5.75 |
| Solution 14 | 2.02 | 1.92 | 1.58 |
|  | 2.93 | 3.47 | 5.60 |
| Solution 15 | 2.01 | 1.94 | 1.62 |
|  | 2.84 | 3.28 | 5.12 |
| Solution 16 | 2.05 | 1.97 | 1.63 |
|  | 2.76 | 3.23 | 5.10 |

The investigation of the operating lifetime again showed in this case that the PLEDs made from all 4 solutions had analogous values within the boundary of measurement accuracy.

The results from Example 4 show the following:

Analogously to Example 1, it is shown here for a completely different polymer that the steepness of the LV (and thus also IV) curves also increases here at increasing methanol contents. The efficiencies are virtually unchanged (within the boundary of measurement accuracy).

What is claimed is:

1. A solution comprising: (i) at least one organic semiconductor, (ii) at least one organic solvent A having a boiling point, and (iii) at least one organic solvent B having a boiling point; wherein the at least one organic semiconductor comprises at least one high molecular weight component, and wherein the at least one organic semiconductor has a solubility of at least 5 g/l at room temperature in the at least one organic solvent A, and wherein the at least one organic semiconductor has a solubility of less than 3 g/l at room temperature in the at least one organic solvent B; and wherein the boiling point of the at least one solvent A is greater than the boiling point of the at least one solvent B.

2. The solution according to claim 1, wherein the at least one organic semiconductor has a solubility of less than 0.3 g/l at room temperature in the at least one organic solvent B.

3. The solution according to claim 1, wherein the at least one organic semiconductor comprises a single high molecular weight component.

4. The solution according to claim 1, wherein the at least one organic semiconductor comprises a mixture of two or more components at least one of which has semiconducting properties.

5. The solution according to claim 1, wherein at least one high molecular weight component has a molecular weight $M_w$ greater than 50,000 g/mol.

6. The solution according to claim 1, wherein the at least one organic semiconductor comprises a polymer selected from the group consisting of substituted poly-p-arylenevinylenes, polyfluorenes, polyspirobitluorenes, poly-p-phenylenes, poly-p-biphenylenes, polydihydrophenanthrenes, trans- and cis-polyindenofluorenes, polyphenanthrenes, polythiophenes, polypyridines, polypyrroles, copolymers which have structural units from two or more of these classes, polyvinylcarbazoles, triarylamine polymers and/or polymers having phosphorescent units, and mixtures thereof.

7. The solution according to claim 1, wherein the at least one organic semiconductor comprises a non-conducting polymer admixed with a low molecular weight, oligomeric, dendritic, branched, organic or organometallic semiconductor.

8. The solution according to claim 1, wherein the at least one organic semiconductor is present in an amount of 0.01 to 20% by weight.

9. The solution according to claim 1, wherein the boiling point of the at least one organic solvent A is greater than 110° C. and less than 300° C.

10. The solution according to claim 1, wherein the boiling point of the at least one organic solvent B is greater than 50° C. and less than 250° C.

11. The solution according to claim 1, wherein the difference between the boiling point of the at least one organic solvent A and the boiling point of the at least one organic solvent B is greater than 10° K.

12. The solution according to claim 1, wherein the at least one organic solvent A is present in an amount of 70 to 99.8% by volume and the at least one organic solvent B is present in an amount of 0.2 to 30% by volume.

13. The solution according to claim 1, wherein the at least one organic solvent A comprises a compound selected from the group consisting of mono- or polysubstituted aromatic solvents, formic acid derivatives, N-alkylpyrrolidones, high-boiling ethers and mixtures thereof.

14. The solution according to claim 1, wherein the at least one organic solvent B comprises a compound selected from the group consisting of alkanes, terpenes, (cyclo)aliphatic alcohols, ethers, ketones, carboxylic acid esters, mono- or polysubstituted aromatic solvents having long chain alkyl or alkoxy substituents.

15. A process comprising:
(a) providing a solution according to claim 1;
(b) applying the solution to a substrate to form an organic semiconductor layer on the substrate.

16. The process according to claim 15, wherein applying the solution to the substrate comprises printing.

17. The process according to claim 16, wherein the printing comprises ink-jet printing.

18. The process according to claim 15, wherein applying the solution to the substrate comprises an area-coating process.

19. The solution according to claim 1, wherein the at least one organic semiconductor has a solubility of less than 1 g/l at room temperature in the at least one organic solvent B.

* * * * *